United States Patent
Seki et al.

[11] Patent Number: 5,293,077
[45] Date of Patent: Mar. 8, 1994

[54] POWER SWITCHING CIRCUIT

[75] Inventors: Kunio Seki, Hinode; Yasuhiro Nunogawa, Takasaki; Hirotaka Mochizuki, Fujioka; Makoto Kobayashi, Sayama; Makoto Goto, Takasaki, all of Japan

[73] Assignees: Hitachi, Ltd., Tokyo; Hitachi Microcomputer Engineering, Ltd., Kodaira, both of Japan

[21] Appl. No.: 920,170

[22] Filed: Jul. 27, 1992

Related U.S. Application Data

[63] Continuation of Ser. No. 313,859, Feb. 23, 1989, abandoned.

[30] Foreign Application Priority Data

Feb. 29, 1988 [JP] Japan .................................. 63-47193
Apr. 5, 1988 [JP] Japan .................................. 63-83699

[51] Int. Cl.$^5$ .......................... B60L 1/14; G05F 1/00; G05F 1/44; H05B 37/02
[52] U.S. Cl. .................................. 307/10.8; 323/282; 323/288; 315/209 R; 315/307
[58] Field of Search ............... 323/282, 288, 351; 307/10.1, 10.2, 10.3, 10.8; 315/307, 310, 311, 209 R; 363/23

[56] References Cited

U.S. PATENT DOCUMENTS

| | | | |
|---|---|---|---|
| 3,959,714 | 5/1976 | Mihelich | 323/288 |
| 4,016,459 | 4/1977 | Boehringer | 361/78 X |
| 4,016,596 | 4/1977 | Magdo et al. | 357/50 X |
| 4,156,166 | 5/1979 | Shapiro et al. | 323/288 X |
| 4,160,945 | 7/1979 | Schorr | 361/19 X |
| 4,218,647 | 8/1980 | Haas | 361/18 X |
| 4,237,405 | 12/1980 | Kellis | 323/288 X |
| 4,325,021 | 4/1982 | McMackin | 323/288 X |
| 4,529,456 | 7/1985 | Anzai et al. | 357/43 X |
| 4,536,700 | 8/1985 | Bello et al. | 323/288 X |
| 4,566,052 | 1/1986 | Kammiller | 361/91 X |
| 4,667,121 | 5/1987 | Fay et al. | 323/351 X |
| 4,716,510 | 12/1987 | Pace et al. | 363/49 |
| 4,717,868 | 1/1988 | Peterson | 323/288 |
| 4,752,589 | 6/1988 | Schaber | 357/43 X |
| 4,772,567 | 9/1988 | Hirao | 357/43 X |
| 4,772,995 | 9/1988 | Gautherin et al. | 323/288 X |
| 4,806,842 | 2/1989 | Bittner | 323/222 |
| 4,816,982 | 3/1989 | Severinsky | 363/44 |
| 4,837,495 | 6/1989 | Zansky | 323/222 |
| 4,849,683 | 7/1989 | Flolid | 323/285 X |

Primary Examiner—Sharon D. Logan
Attorney, Agent, or Firm—Antonelli, Terry, Stout & Kraus

[57] ABSTRACT

When a current that flows into a power output element is greater than a predetermined value, pulse width-modulated signals are formed which vary in inverse proportion to the current value in order to drive the power output element. When an excess current flows into the power output element, therefore, the power output element is allowed to intermittently operate for only short periods of time, and the current can be decreased during the current-limiting operation.

47 Claims, 3 Drawing Sheets

POWER SWITCHING CIRCUIT

This application is a continuation of application Ser. No. 07/313,859 filed on Feb. 23, 1989 now abandoned.

BACKGROUND OF THE INVENTION

The present invention relates to a power switching circuit. More specifically, the present invention relates to technology that can be effectively utilized for a power switching circuit for turning on a vehicle lamp using a power MOSFET (insulated gate field-effect transistor).

The protecting circuit for the overcurrent such as when the load is short-circuited may be of the type having a feedback which operates to turn the output element off when the output current exceeds a predetermined value or of the type wherein the current is limited to a predetermined value. The power switching circuit equipped with such a protecting circuit has been disclosed in, for example, a journal "Electronic Technology" (Smart Power MOS IC), January, 1987, pp. 22-25.

When a lamp mounted on a vehicle is driven by the power switching circuit, the filament exhibits a very small resistance at a moment when the lamp is turned on and a very large current flows. The resistance then increases with the lapse of time as the heat is generated by the filament, and the current that flows decreases. The overcurrent protecting circuit works when such a load is driven. Therefore, the lamp is kept from being turned on by the protecting system which turns the output element off in response to an overcurrent detection signal. In the system which limits the output current to a predetermined value in response to the output overcurrent detection, on the other hand, a given amount of current flows even when the lamp has a small resistance. Therefore, the electric power is consumed in large amounts by the power switching circuit (IC) leaving a problem from the standpoint of protecting the output power element. Moreover, since the current is limited, an extended period of time is required before the lamp is completely turned on.

The object of the present invention is to provide a power switching circuit which consumes reduced amount of electric power during the current-limiting operation.

Another object of the present invention is to provide a power switching circuit adapted to driving the lamp.

The above and other objects as well as novel features of the present invention will become obvious from the description of the specification and the accompanying drawings.

A representative example of the invention disclosed in the present application will now be described briefly. That is, when a current flowing into the power output element is greater than a predetermined value, pulse width-modulated signals are formed that vary in inverse proportion to the current value (magnitude), in order to drive the power output element.

According to the above-mentioned means, the power output element is allowed to intermittently operate for only short periods of time when an excess current flows, and the flow of current can be decreased during the current-limiting operation.

DESCRIPTION OF THE PREFERRED EMBODIMENTS

Figure 1:
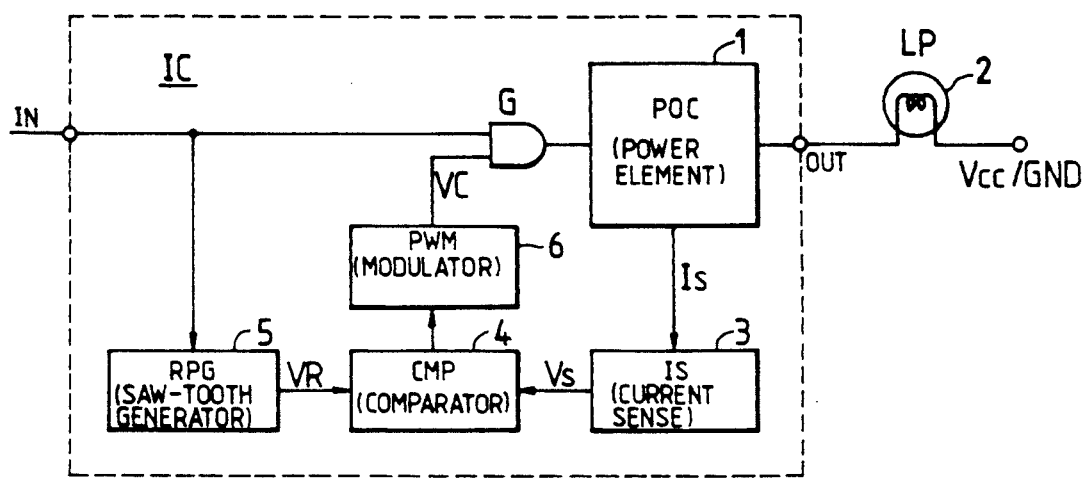
FIG. 1 is a block diagram illustrating an embodiment of when a power switching circuit according to the present invention is used for a lamp driving circuit.

FIG. 1 is a block diagram of an embodiment in which a power switching circuit according to the present invention is used for a circuit for driving vehicle lamps. In FIG. 1, though there is no particular limitation, the circuit blocks surrounded by a broken line are formed on a semiconductor substrate such as single crystalline silicon by the known technology for producing semiconductor integrated circuits.

A power output circuit POC (1) works as a switch for forming a current that drives a vehicle lamp LP (2). Though there is no particular limitation, the power output circuit POC (1) is constituted by a power MOSFET. Relative to the switching element consisting of the power MOSFET, the lamp LP (2) is connected to power source voltage Vcc or ground potential GND of the circuit. When the above lamp LP (2) is mounted on a vehicle, it is desired that the switching element forms a high-side drive circuit. That is, the output circuit POC (1) is connected to the side of the power source voltage and the lamp LP (2) is connected to the side of ground potential GND of the circuit. The power output circuit POC (1) is constituted in the form of source follower output. With the above-mentioned high-side drive system being employed, even in case the lamp LP (2) is broken due to traffic accident and is short-circuited to the chassis (ground), the protecting circuit of the power output circuit POC (1) works to limit the flow of current. Therefore, fire is prevented from occurring. With the high-side drive system, furthermore, ground potential is obtained by utilizing the chassis enabling the lamp LP (2) to be easily mounted.

A sense current Is that corresponds to the drive current of the power output circuit POC (1) is detected by a current sense circuit IS (3). The current sense circuit IS (3) converts the sense current Is into a voltage signal Vs and produces it.

A comparator circuit CMP (4) compares the voltage signal Vs with a lamp saw-tooth voltage waveform of a series of ramp voltages (saw-tooth waves) VR formed by a saw-tooth wave generating circuit RPG (5).

The saw-tooth wave generating circuit RPG (5) may be constituted by a capacitor and a constant-current source. When the capacitor is used, however, an external part is necessary. According to this embodiment, therefore, the saw-tooth wave generating circuit RPG (5) is constituted by a counter circuit and a D/A (digital-to-analog) converter circuit which receives the counted output thereof. This structure does not need the capacitor and can be contained in a semiconductor integrated circuit IC, and makes it possible to form saw-tooth waves having a relatively long time depending upon the frequency of input pulses input to the counter circuit and the bit number thereof.

The output signal of the comparator circuit CMP (4) is input to a pulse width modulating circuit PWM (6). When the sense current IS is greater than the predetermined value which can be regarded to be an overcurrent, the pulse width modulating circuit PWM (6) forms a drive signal VC having a pulse width that varies in inverse proportion to the value of the sense current Is.

Instead of employing the above-mentioned constitution, however, the output signal may be fixed to, for example, the low level so that when the input signal Vs to the comparator circuit CMP (4) is smaller than the predetermined value which can be regarded to be the normal operation, the comparator circuit CMP (4) substantially ceases the operation for comparing the input signal Vs with the saw-tooth voltage VR and no longer permits the pulse width modulating circuit PWM (6) to continue its operation.

The drive signal VC serves as a control signal for a gate circuit G that selectively transmits the input signal IN to the control terminal of the power output circuit POC (1). In other words, since the input signal IN is selectively utilized in response to the signal VC, the power output circuit POC (1) is intermittently driven by the output signal VC that is formed by the pulse width modulating circuit PWM (6).

Figure 2:
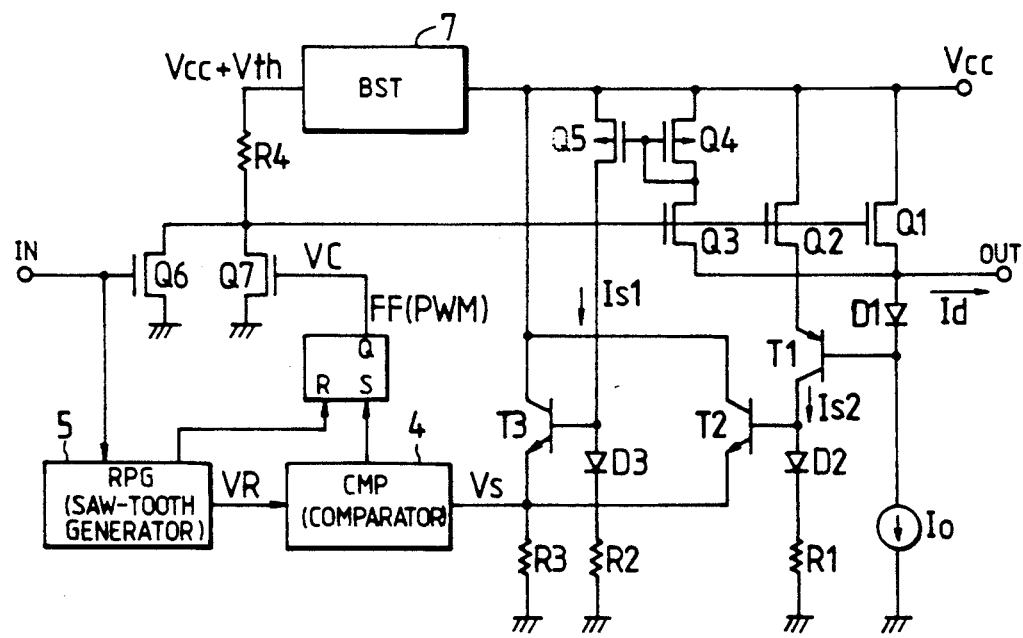
FIG. 2 is a circuit diagram which concretely illustrates the embodiment.

FIG. 2 is a circuit diagram which concretely illustrates an embodiment of the power output circuit POC (1), wherein p-channel MOSFETS are distinguished from the n-channel MOSFETS as indicated by arrows attached to channel (back gate) portions thereof.

The drain of the power MOSFET Q1 which is an n-channel MOSFET is connected to a power source voltage Vcc. N-channel drive MOSFETS Q6 and Q7, and a load resistor R4, connected to the common drain thereof, constitute a drive circuit which forms a drive voltage that will be applied to the gate of the MOSFET Q1. The drive circuit works as a NOR gate circuit which corresponds to the gate circuit G of FIG. 1.

A voltage Vcc+Vth obtained by boosting the power source voltage Vcc by a booster circuit BST (7) is used as an operation voltage of the drive circuit. A control signal IN is supplied to the gate of the drive MOSFET Q6, and a control signal VC (pulse width-modulated signal) is supplied to the gate of the other drive MOSFET Q7.

The source of the power MOSFET Q1 is connected to the output terminal OUT, and a lamp LP (2) (not shown) that is shown in FIG. 1 is provided between the output terminal OUT and a ground potential point of the circuit.

When the control signal IN has the low level, for instance, the MOSFET Q6 is turned off. When the MOSFET Q7 is turned off due to the control voltage VC of the low level, the operation voltage Vcc+Vth boosted through the resistor R4 is supplied to the gate of the power MOSFET Q1. The boosting voltage +Vth formed by the booster circuit BST (7) has been set to substantially the threshold voltage of the MOSFET Q1, although it can be greater. When the MOSFET Q1 is turned on, therefore, the power source voltage Vcc is directly produced from the source thereof, whereby a high signal voltage is produced from the output terminal OUT.

Though there is no particular limitation, the following circuit is provided as the current sense circuit IS (3) for sensing the operation current of the MOSFET Q1.

To monitor the drive current Id that flows into the MOSFET Q1, i.e., through the channel of Q1, there are provided two MOSFETS Q2 and Q3 having gates common to the gate of the MOSFET Q1. The source of the MOSFET Q3 is commonly connected to the source of the output MOSFET Q1 thereby to form a substantial current mirror circuit. Therefore, into the MOSFET Q3 flows a sense current Is1 corresponding to the output current (drive current) Id that varies according to the ratio of its size to the size of the MOSFET Q1. The current is produced through the p-channel MOSFETS Q4 and Q5 that form the current mirror circuit.

Owing to the employment of the system in which the current formed by the MOSFET Q3 is obtained through the MOSFETS Q4 and Q5 that form a current mirror circuit, the MOSFETS Q4 and Q5 produce no operation voltage once the voltage at the output terminal OUT reaches the level of the power source voltage Vcc, and, as a result the sense current Is1 is no longer permitted to flow. That is, in a high voltage region in which a voltage difference between the output terminal OUT and the power source voltage Vcc becomes smaller than the threshold voltage of the MOSFETS Q4 and Q5, it becomes difficult to take out the sense current Is1 formed by the MOSFET Q3.

Therefore, provision is made of the MOSFET Q2 so that the drive current Id of the output MOSFET Q1 can be monitored even when such a high output voltage is formed. The MOSFET Q2 has the same size as the MOSFET Q3. Therefore, the sense currents Is1 and Is2 formed by the MOSFETS Q3 and Q2 in response to drive current Id flowing into the output MOSFET Q1, have the same value when their respective circuits are operated on a sufficiently large operation voltage. The drain of the MOSFET Q2 is connected to the power source voltage Vcc and the source thereof is connected to the emitter of a pnp transistor T1. The base of the transistor T1 is connected to the source of the output MOSFET Q1 via diode D1. The diode D1 is provided with a constant-current source for flowing a bias current Io. The bias current Io is set to be a small value such that the diode D1 is maintained turned on.

According to the aforementioned constitution, the source potentials of the MOSFETS Q1 and Q2 become nearly equal to each other via diode D1 and base and emitter of the transistor T1, whereby a current mirror circuit is equivalently formed. Therefore, the sense current Is2 is obtained from the collector of the transistor T1. When the output voltage is low at the output terminal OUT, the diode D1 and the transistor T1 have no operation voltage, and the sense current Is2 is not obtained contrary to the sense current Is1.

In the current sense circuit of this embodiment, the following current select circuit is provided such that either the sense current Is1 or the sense current Is2 is selected i.e. whichever one is the larger is automatically selected and is produced. The currents Is1 and Is2 flow through series circuits constituted by a diode D3 and a resistor R2, and a diode D2 and a resistor R1, respectively. Voltages generated by the sense currents Is1 and Is2 across the series circuits are applied to the bases of the transistors T3 and T2, respectively. The transistors T2 and T3 have common collectors and emitters, the common collector being connected to the power source voltage Vcc and the common emitter being provided with the resistor R3.

When the sense current Is1 is greater than the sense current Is2 in the above-mentioned constitution, the transistor T3 is turned on and its emitter produces a sense voltage Vs that corresponds to Is1×R2. When the sense current Is1 is smaller than the sense current Is2, on the other hand, the transistor T2 is turned on and its emitter produces a sense voltage Vs that corresponds to Is2×R1. When the sense current Is1 is equal to the sense current Is2, the transistors T2 and T3 are both turned on, and a voltage Vs of Is1×R2 (=Is2×R1) is produced. The resistors R1 and R2 have the same resistance, and the transistors T2, T3 and diodes D2, D3 have the same characteristics. That one of the above-mentioned sense currents which is the larger than is thus obtained from the common collector of the transistors T2 and T3. In this case, the transistor T3 and the diode D3, and the transistor T2 and the diode D2, have the same area ratios, and the resistors R1 to R3 have the same resistance.

The voltage Vs is supplied to the comparator circuit CMP (4) together with a lamp voltage VR formed by the saw-tooth wave generating circuit RPG (5), and the output signal of the comparator circuit CMP (4) is supplied to a set terminal S of a flip-flop circuit FF that constitutes the pulse width modulating circuit PWM (6). A start signal of the saw-tooth wave generating circuit RPG is supplied to the reset terminal R of the flip-flop circuit FF. The output Q of the flip-flop circuit FF is supplied as the control signal VC to the gate of a drive MOSFET Q7.

Figure 7:
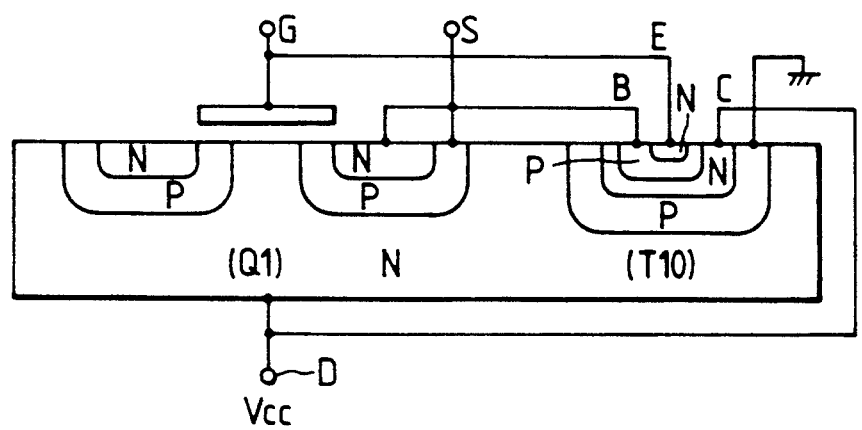
FIG. 7 is a section view which schematically shows the structure of the power MOSFET according to the embodiment.

Though there is no particular limitation, the power MOSFET Q1 has a drain region formed in the n-type substrate as shown in FIG. 7. Therefore, the drain electrode is provided on the side of the back surface of the substrate. A p-type channel region constituting the power MOSFET Q1 is formed like a ring in the front surface of the substrate. A ring-like n-type source region is also formed in the surface of the p-type channel region. A gate electrode is formed via a gate insulating film on the surface of a channel region sandwiched between the source region and the substrate that works as the drain region. The source region and the channel region are commonly connected together to work as a source electrode. Therefore, the drive current formed by the MOSFET Q1 flows in the direction of thicknesss of the substrate.

The power MOSFET Q1 and the aforementioned circuits are formed on the same substrate. Therefore, a p-type isolation region is formed in the n-type substrate, and circuit elements that constitute the circuits are formed via the p-type isolation region.

Figure 3:
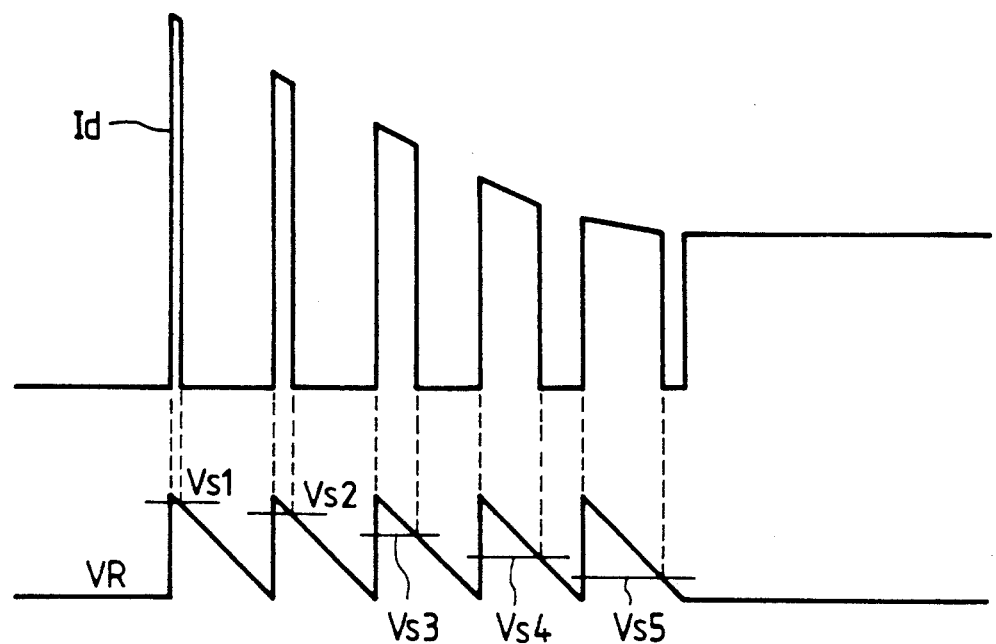
FIG. 3 is a diagram of waveforms for explaining the operation for driving the lamp.

Operation of the power switching circuit shown in FIG. 2 will now be described in conjunction with a waveform diagram of FIG. 3.

As the input signal IN assumes the low level, the drive MOSFET Q6 is turned off. In response to the input signal IN of the low level, the saw-tooth wave generating circuit RPG (5) starts operation to generate the saw-tooth voltage waveform VR and resets the flip-flop circuit FF. Since the MOSFET Q7 is turned off, the boosted voltage Vcc+Vth formed by the boosting circuit BST (7) is applied via resistor R4 to the gate of the MOSFET Q1 (Q2 and Q3) so that it is turned on.

The output MOSFET Q1 that is turned on permits a lighting current Id to flow into the lamp LP (2). The drive current Id is large at a moment when the lamp LP (2) is turned on since its resistance is small. The sense current Is increases in response to the drive current Id, and a large voltage Vs1 is obtained. Therefore, the saw-tooth voltage waveform VR reaches the sense voltage Vs1 at an early time. The voltage comparator circuit CMP (4) detects this and sets the flip-flop circuit FF. The output signal VC (pulse width-modulated signal) assumes the high level, and the MOSFET Q7 is turned on. Despite the input signal IN having the low level, therefore, the gate voltage of the output MOSFET Q1 (Q2 and Q3) assumes the low level such as ground potential so that it is turned off. Therefore, the drive current supplied to the lamp LP (2) is limited to a current having a narrow pulse width.

When the saw-tooth wave generating circuit RPG (5) oscillates to produce another saw-tooth wave of the saw-tooth voltage waveform VR, the flip-flop circuit FF is reset, whereby the drive voltage is formed to turn the output MOSFET Q1 (Q2, Q3) on again and the drive current Id flows again into the lamp LP (2). In this case, the resistance of the lamp LP (2) increases due to the heat generated in the previous time of turn on, and the value of drive current Id decreases correspondingly. Therefore, the sense voltage Vs2 corresponding to the drive current Id slightly decreases compared with the sense voltage Vs1 of the previous time, and the time is lengthened correspondingly before the saw-tooth voltage waveform VR reaches the sense voltage Vs2. In response thereto, the timing at which the flip-flop circuit FF is set is delayed, and the time is lengthened in which the output MOSFET Q1 is maintained turned on to flow the drive current Id. That is, the output VC of the flip-flop circuit FF has a pulse width that varies in inverse proportion to the drive current Id. Similarly, the pulse width of the output VC increases with the decrease in the resistance of the lamp LP (2) or, in other words, with the decrease in the drive current Id. Then, as the drive current Id assumes a constant value which is not regarded to be an overcurrent, the comparator circuit CMP (4) no longer produces a signal that sets the flip-flop circuit FF. Thereto, the MOSFET Q7 is maintained turned off, and the output MOSFET Q1 (Q2, Q3) is turned on so far as the input signal IN assumes the low level to form a current for driving (turning on) the lamp LP. To carry out the control operation as described above, the comparator circuit CMP (4) has two voltage comparator circuits which are not shown, whereby one voltage comparator circuit compares the sawtooth voltage waveform VR with the sense voltage Vs and the other voltage comparator circuit compares the sense voltage Vs with a predetermined reference voltage. The latter voltage comparator circuit inhibits the flip-flop circuit FF from being set and, further, works, for example, to stop the operation of the saw-tooth wave generating circuit PRG (5).

When the lamp is turned on as described above in this embodiment, the protecting circuit forms pulse width-modulated signals that vary in inverse proportion to the output current to control the operation period of the output MOSFET Q1. Therefore, the time is shortened in which the drive current flows at the start of turn on, and the output MOSFET Q1 is protected from being destroyed. Then, as the current is supplied and the resistance of the lamp LP (2) increases, the drive current decreases. Using the pulse width-modulated signals formed in response thereto, therefore, the time is lengthened for flowing the drive current, and the time required for completely turning the lamp LP on is shortened.

Figure 4:
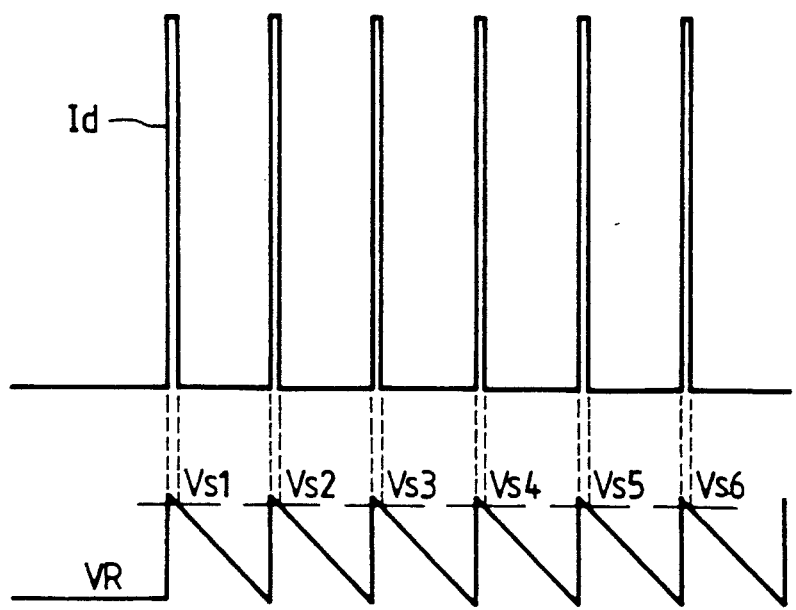
FIG. 4 is a diagram of waveforms for explaining the protecting operation under the condition where the load is short-circuited.

FIG. 4 is a diagram of waveforms for explaining the short-circuited condition of the load.

An excess current flows into the output MOSFET Q1 under the condition where the load is short-circuited. Since the voltage Vs increases in response to the current, the time is shortened in which the output MOSFET Q1 is maintained turned on in comparison with the saw-tooth voltage waveform VR; i.e., the output MOSFET Q1 is turned off readily. Hereinafter, the above operation is repeated as far as the short-circuited condition continues, and the output MOSFET Q1 is protected. According to this constitution, the output current flows only instantaneously under the short-circuited condition, and the output MOSFET is protected from breaking.

Described below are the functions and effects obtained according to the above-mentioned embodiment.

(1) When the current that flows into the power output element is greater than a predetermined value, a pulse width-modulated signal is formed that is inversely proportional to the current value to control the power output element. When an overcurrent flows in this constitution, the power output element is intermittently operated for only short periods of time and the current decreased during the current-limiting operation.

(2) When the vehicle lamp is to be driven according to (1) above, the lighting current is supplied for only a predetermined period of time that does not destroy the power output element, and the lamp is allowed to have an increased resistance. Therefore, the lamp can be turned on while preventing the power output element from breaking owing to the repetition of the above-mentioned operation.

(3) Operation of the power output element is controlled by the pulse width-modulated signals that vary in inverse proportion to the drive current in order to form a drive current that corresponds to the ability of the power output element, and the lamp can be turned on quickly.

Though the invention accomplished by the present inventors was concretely described in the foregoing by way of an embodiment, it should be noted that the present invention is in no way limited to the aforementioned embodiment only but can be varied in a variety of ways without departing from the spirit and scope of the invention. For instance, the power output element may be a bipolar power transistor or an IGBT (insulated gate bipolar transistor) in addition to the power MOSFET. The power output MOSFET is constituted by small MOSFETS (cell transistors) arranged in parallel formed by thousands of independent source cells, and some of the cells are connected to the resistors for detecting a current. Here, the voltage drop may be used as a sense voltage Vs for monitoring the drive current of when the power output MOSFET is used.

Further, the circuits for forming the pulse width modulated signals may be constituted in a variety of forms. Moreover, it need not be pointed out that provision may be made of protecting circuits for the overvoltages and temperature in addition to the protecting circuit for the overcurrents. When the load is provided on the drain side of the power output element, there is no need of providing the booster circuit.

The present invention can be extensively adapted to power switching circuits in addition to the aforementioned lamp drive circuit.

Figure 5:
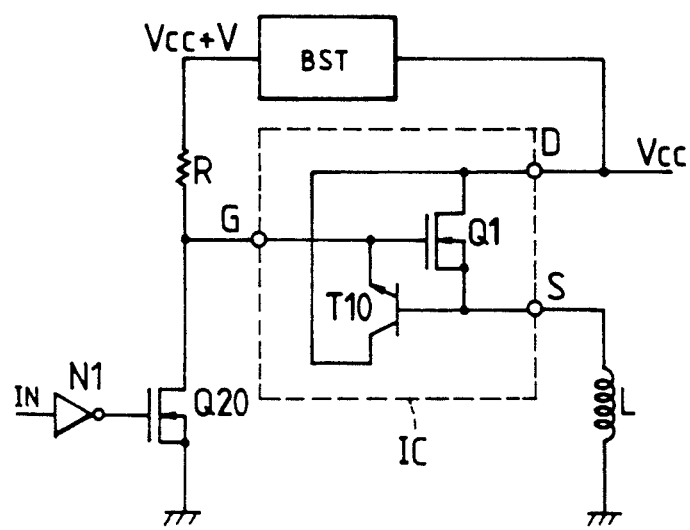
FIG. 5 is a circuit diagram showing a circuit for protecting the power MOSFET according to an embodiment of the present invention.

FIG. 5 shows a transistor T10 for protecting the power transistor Q1 that drives the inductive load. The protecting transistor T10 can be applied to the power transistor Q1 that is shown in FIG. 2.

When the load such as an electric motor is to be driven using the power MOSFET, the protecting circuit for preventing the gate insulation of the power MOSFET from breaking may usually be comprised of a Zener diode which is an external element.

When the protecting element is constituted by an external part, however, the number of elements increases. Therefore, the present inventors have attempted to contain the protecting element in the power MOSFET. It was, however, discovered by the present inventors that when the Zener diode is formed on the substrate to protect the insulation between the gate and the source in the power MOSFET that uses the substrate as the drain region, a parasitic transistor whose base is the region for isolating the Zener diode from the drain of the MOSFET is turned on due to the counter-electromotive force that is generated in the load when the MOSFET is switched from the on condition to the off condition at the time of driving the load that has an inductive component, and an excess current flows to the side of the Zener diode resulting in the destruction of the element.

The power MOSFET Q1 and the transistor T10 can be formed as an integrated circuit IC as indicated by a broken line in FIG. 5. As will be described later, furthermore, the power MOSFET Q1 uses the substrate as the drain region, and has a drain electrode formed on the back surface of the substrate.

The transistor T10 is connected at its base to the source S of the power MOSFET Q1 and is connected at its emitter to the gate G of the power MOSFET Q1. In order to prevent the development of parasitic transistors that will be described later, the collector of the transistor T10 is connected to the drain D of the power MOSFET Q1. Attention should be given to the fact that this constitution is different from the constitution in which the collector is connected to the base which is usually done when the transistor is to be used as a diode or, in other words, when the transistor is to be connected in the form of a diode.

The drain of the power MOSFET Q1 is coupled to the power source voltage Vcc, and the gate thereof is provided with a drive circuit which consists of a drive MOSFET Q2 and a load resistor R. A voltage Vcc+V obtained by boosting the power source voltage Vcc by the booster circuit BST is used as the operation voltage of the drive circuit. Though there is no particular limitation, a control signal In is supplied, via an inverter circuit N1, to the gate of the drive MOSFET Q20. Though not specifically limited, the operation voltage of the inverter circuit N1 is of the 5-volt system which is lower than the power source voltage Vcc. Therefore, the control signal In has a relatively low logic level consisting of the high level of 5 V and the low level which is ground potential of the circuit. Therefore, the drive circuit consisting of the inverter circuit N1, MOSFET Q20 and resistor R, performs a level conversion operation.

The power MOSFET Q1 is provided with a load inductance L at the source thereof. The constitution in which a drive element is provided between the load and the power source voltage Vcc is called a high-side drive circuit (source follower circuit).

When the control signal In has the high level, for instance, the inverter circuit N1 produces an output signal of the low level. When the drive MOSFET Q20 is turned off in response to the output signal of the low level, the operation voltage Vcc +V boosted through the resistor R is supplied to the gate G of the power MOSFET Q1. If the boosting voltage+V formed by the booster circuit BST is set to be greater than a substantial threshold voltage of the MOSFET Q1, the power source voltage Vcc is directly produced from the source S when the MOSFET Q1 is turned on; i.e., a high output voltage is obtained.

When the MOSFET Q1 is switched from the off condition to the on condition, a Zener diode is formed between the gate and the source thereof due to the pn junction of emitter and base of the transistor T10, and a voltage applied across the gate and the source is clamped by the breakdown voltage thereof to protect the breakdown voltage.

When the control signal IN changes from the high level to the low level, the output signal of the inverter circuit N1 assumes the high level to turn the drive MOSFET Q20 on. Therefore, the low level such as ground potential of the circuit is applied to the gate G of the power MOSFET Q1. In response thereto, the power MOSFET Q1 is switched from the on condition to the off condition. In this case, a counterelectromotive force generates in the load inductance L so that the source S of the power MOSFET Q1 assumes a negative potential. The power MOSFET Q1 which is served with ground potential of the low level is turned on when the source potential assumes a negative voltage by an amount equal to the threshold voltage thereof, and a current that corresponds to the counterelectromotive force is supplied to the load inductance L. In this case, a current corresponding to the counterelectromotive force is supplied from the power MOSFET Q1 so that absolute value of the source S potential will not become so great. For example, when the potential of the source S tends to become greater than the breakdown voltage across emitter and base of the transistor T10, a current also flows from the side of the transistor T10 to clamp the potential of the source S. Even when being switched to the off condition, therefore, the transistor T10 works to protect the breakdown voltage.

Figure 6:
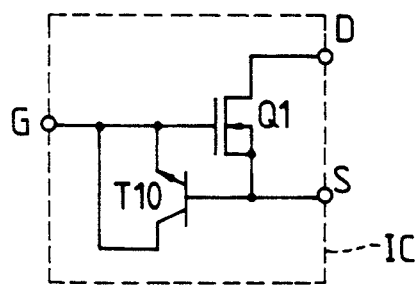
FIG. 6 is a circuit showing the protecting circuit according to another embodiment.

FIG. 6 is a circuit diagram of the power MOSFET Q1 according to another embodiment. In this embodiment, the collector of the protecting transistor T10 that is to be embedded is connected to the emitter or, in other words, connected to the gate of the power MOSFET Q1. The power MOSFET Q1 (T10) which is so constituted is also used as a drive circuit as shown in FIG. 5.

FIG. 7 is a section view which schematically illustrates the structure of the power MOSFET Q1 and the transistor T10 of FIGS. 5 and 6.

The power MOSFET Q1 uses the n-type substrate as the drain region. Therefore, the drain electrode D is provided on the side of back surface of the substrate. The p-type channel region which constitutes the power MOSFET Q1 is formed like a ring in the surface of the substrate. Similarly, a ring-like n-type source region is formed on the surface of the p-type channel region. A gate electrode G is formed via a gate insulating film (not shown) on the surface of a channel region that is sandwiched between the source region and the substrate which serves as a drain region. The source region and the channel region are commonly connected together to form a source electrode 8.

The transistor T10 for protecting the breakdown voltage between the gate and the source of the power MOSFET Q1 is formed in a p-type isolation region formed on the side of the front surface of the substrate. That is, the n-type collector region is formed in the p-type isolation region, the p-type base region is formed in the n-type collector region, and the n-type emitter region is formed in the p-type base region, thereby to obtain the transmitor T10.

The emitter E of the transistor T10 is connected to the gate electrode G of the MOSFET Q1. The base B of the transistor T10 is connected to the source electrode S of the MOSFET Q1. The collector C of the transistor T10 is connected to the drain electrode D (gate electrode G in the embodiment of FIG. 6) of the MOSFET Q1.

The isolation region for isolating the transistor T10 from the drain region of the MOSFET Q1 is connected to a point of ground potential.

When the drive circuit shown, for example, in FIG. 5 is used in this constitution, the power source voltage Vcc applied to the drain is also applied to the collector of the transistor T1. In FIG. 7, therefore, the voltage Vcc is steadily applied to the n-type collector C of the transistor T10, and ground potential of the circuit is steadily applied to the p-type isolation region, enabling the pn junction to be fixed to a reversely biased condition. When the MOSFET Q1 is switched to the off condition, therefore, no parasitic transistor develops even when the counterelectromotive force of the negative polarity is applied to the source. This means that even when the collector of the transistor T10 is connected to the gate of the MOSFET Q1 as shown in FIG. 6, the gate voltage does not become lower than the ground potential, and the collector of the transistor T10 and the p-type isolation region are never biased in the forward direction. Therefore, no parasitic transistor develops even when a negative voltage is applied to the source electrode S as described above.

When the transistor T10 is connected in the form of a general diode instead of the aforementioned constitution, the collector of the transistor T10 is connected to the base in common and is served with a potential of the source electrode S of the MOSFET Q1. When the negative voltage is generated as described above, therefore, the collector of the transistor T10 and the isolation region are forwardly biased, whereby a parasitic transistor is formed with the collector as an emitter, the p-type isolation region as a base and the substrate (drain of MOSFET) as a collector, permitting an excess current to flow into the transistor T10. That is, the transistor T10 is destroyed.

Described below are the functions and effects obtained by the embodiments shown in FIGS. 5, 6 and 7.
(1) In the power MOSFET which uses the substrate as the drain region, the protecting transistor is formed on the same substrate, the base thereof is connected to the source of the MOSFET, the emitter is connected to the gate, and the collector is connected to the base or the drain. In this constitution, the pn junction between the base and the emitter of the transistor is broken down to clamp the voltage applied across the gate and the source of the power MOSFET, in order to protect the breakdown voltage. Moreover, the collector of the transistor is connected to the gate or the drain of the MOSFET so as to reversely bias at all times the collector of the transistor embedded therein and the pn junction in the isolation region which isolates the collector from the drain region of the MOSFET. Therefore, the parasitic transistor is prevented from developing even when the counterelectromotive force is generated in the source of the MOSFET due to the inductive load. (2) Owing to the advantage mentioned in (1) above, there is no need of using the external element for protecting the gate breakdown voltage of the power MOSFET. Therefore, drive circuits employing the power MOSFET's can be simplified.

The above-mentioned embodiment can be varied in a variety of ways. For instance, the power MOSFET may be provided in a plural number on one semiconductor substrate. In this case, the power MOSFET which uses the substrate as the drain is inevitably used as a high-side drive circuit (source follower circuit) in which the drain is commonly used. In addition to driving the inductance load such as the motor or the solenoid shown in FIG. 5, the power MOSFET can be adapted to an electronic power switching circuit such as a circuit for driving lamps such as head lamps of automobiles to substitute for the traditional mechanical switching elements.

The present invention can be extensively utilized as the power MOSFET.

What is claimed is:

1. A semiconductor integrated circuit device formed on a common semiconductor substrate, comprising:
   an insulated gate field-effect transistor, having a gate, source and drain, and wherein the semiconductor substrate functions as a drain region; and a bipolar transistor which is formed on said semiconductor substrate, said bipolar transistor having an emitter, base and collector and wherein the base is connected to the source of said insulated gate field-effect transistor, the emitter is connected to the gate of said insulated gate field-effect transistor, and the collector is connected to the gate or the drain of said insulated gate field effect transistor.

2. A semiconductor integrated circuit device according to claim 1, wherein said semiconductor substrate is of n-type conductivity, and said bipolar transistor is formed in an isolation region of p-type conductivity that is formed in said semiconductor substrate of n-type conductivity.

3. A semiconductor integrated circuit device according to claim 2, wherein said source is adapted for connection with one end of a load having the other end grounded, and said drain is adapted for connection with a positive power source voltage.

4. A semiconductor integrated circuit device according to claim 3,
   wherein said insulated gate field-effect transistor is of an N-channel conductivity type,
   and wherein said bipolar transistor is an NPN type bipolar transistor.

5. A semiconductor integrated circuit device according to claim 4, wherein the collector of said bipolar transistor is connected to the gate of said insulated gate field effect transistor, said insulated gate field effect transistor being a MOSFET.

6. A semiconductor integrated circuit device according to claim 1, wherein the collector of said bipolar transistor is connected to the gate of said insulated gate field effect transistor, said insulated gate field effect transistor being a MOSFET.

7. A semiconductor integrated circuit device according to claim 4, wherein the collector of said bipolar transistor is connected to the drain of said insulator gate field effect transistor, said insulated gate field effect transistor being a MOSFET.

8. A semiconductor integrated circuit device according to claim 1, wherein the collector of said bipolar transistor is connected to the drain of said insulated gate field effect transistor, said insulated gate field effect transistor being a MOSFET.

9. A power switching circuit according to claim 12, wherein the power output element, driver means and said circuit are formed on a common semiconductor substrate.

10. A power switching circuit according to claim 9, wherein the power output element is a power MOSFET of N-channel conductivity type.

11. A power switching circuit according to claim 10, further comprising:
   a power supply terminal to which a power supply voltage is supplied; and
   wherein the power MOSFET has a source-drain path coupled between the power supply terminal and the output terminal and a gate coupled to receive the output signal of the driver means.

12. A power switching circuit, comprising:
   a power output element coupled to a load element and providing a driving current to said load element;
   driver means coupled to the power output element and providing an output signal to drive said power output element in response to an input signal; and
   a circuit for detecting a current flowing into the power output element and controlling operation of the driver means in accordance with a magnitude of the current detected so that an operating period of the power output element will vary in inverse proportion to the magnitude of the detected current when the magnitude of the detected current is greater than predetermined magnitude, including:
   a first sense circuit for detecting a first current flowing into the power output element when voltage on an output terminal is lower than a predetermined voltage, said power output element having an output end coupled to the output terminal;
   a second sense circuit for detecting a second current flowing into the power output element when the voltage on the output terminal is higher than the predetermined voltage;
   a selecting circuit for selecting that one of said first and second currents which has the greater magnitude;
   current-voltage converting means for converting the one of said first and second currents selected, in accordance with the magnitude thereof, into a voltage signal;
   a saw-tooth wave generator for forming a saw-tooth voltage waveform in response to the input signal;
   a comparator circuit for comparing the converted voltage signal with the saw-tooth voltage waveform and for providing an indication signal which indicates that the converted voltage signal is of a voltage magnitude greater than or equal to that of the saw-tooth voltage waveform; and
   a flip-flop which is set by the indication signal and which is reset by each start of the operation of the saw-tooth wave generator, said flip-flop having an output being supplied to an input of said driver means so as to control the operation of the driver means.

13. A power switching circuit according to claim 11, wherein the driver means includes:
a booster circuit for boosting said power supply voltage to a voltage level of said power supply voltage plus the threshold voltage of said power MOSFET, wherein said boosted voltage is supplied to the gate of the power MOSFET,
a first control MOSFET having a gate coupled to receive the input signal and a source-drain path coupled between the gate of the power MOSFET and a ground potential terminal of the circuitry, and
a second control MOSFET having a gate coupled to receive the output of the flip-flop and a source-drain path coupled between the gate of the power MOSFET and the ground potential terminal.

14. A power switching circuit, comprising:
a power output element coupled to a load element and providing a driving current to the load element;
driver means coupled to the power output element and providing an output signal to drive the power output element in response to an input signal; and
a circuit which includes means for detecting a current flowing into the power output element and means for controlling operation of the driver means in accordance with a magnitude of the current detected by the detecting means so that an operating period of the power output element will vary in inverse proportion to the magnitude of the detected current when the magnitude of the detected current is greater than a predetermined magnitude,
wherein the controlling means includes a flip-flop circuit coupled to the driver means and having first and second logic states, the first logic state thereof occurring when the driving current is being provided to the load element, and the second logic state thereof occurring when a supply of the driving current to the load element is being inhibited,
wherein the load element to be coupled has a resistance characteristic in which the resistance thereof is very small at a moment when the load element is first driven, during start-up of operation of the load element, and that the resistance thereof increases with time as heat is being generated therefrom,
wherein the magnitude of the driving current is inversely responsive to the amount of heat being generated from the load element, the driving current during a normal operating condition of the load element is in the form of intermittent pulse signals during an initial part of the operation of the load element, respectively of progressively decreasing magnitudes and increasing pulse-widths, beginning with an initial driving current pulse signal of a maximum magnitude and minimum pulse-width when the power element is first driven, until a steady-state load element operating condition is effected at which time the drive current remains constant for the duration of the input signal, and
wherein in response to detection of an overcurrent condition at the power output element, of a magnitude substantially greater than the predetermined magnitude, the operating period of the power output element is limited to provide a series of current pulses as the driving current to the load element, for the duration of the input signal, thereby to prevent breakdown of the power output element.

15. A power switching circuit according to claim 14, wherein the load element is a lamp with a filament.

16. A semiconductor integrated circuit for driving a lamp mounted on a vehicle, comprising:
a power supply terminal to which a power supply voltage is supplied;
an output terminal coupled to the lamp;
an input terminal coupled so as to receive an input signal;
a power MOSFET having a source-drain path coupled between the power supply terminal and the output terminal, said power MOSFET providing via the source-drain path thereof a driving current for turning the lamp on in response to a driving signal corresponding to a voltage level of said power supply voltage plus at least the threshold voltage of said power MOSFET and which is applied to a gate of the power MOSFET;
driver means responsive to the input signal and providing the driving signal to the gate of the power MOSFET to turn the power MOSFET on, the driver means including means for selectively turning the power MOSFET off in response to a control signal;
detecting means coupled to the power MOSFET and providing an output in accordance with a magnitude of the driving current detected; and
control means for controlling operation of the means for selectively turning the power MOSFET off in response to the output of the detecting means,
wherein the control means includes a bistable circuit coupled to the means for selectively turning the power MOSFET off and providing the control signal when the magnitude of the driving current is greater than a predetermined value so that lighting periods of the lamp become less regular,
wherein the control signal is a pulse width-modulated signal effecting an operating period of the power MOSFET which varies inversely to the magnitude of the detected driving current when the driving current is greater than the predetermined value,
wherein the magnitude of the driving current is inversely responsive to the amount of heat being generated by the lamp, the driving current during a normal operation condition of the lamp is in the form of intermittent pulse signals during an initial part of the operation of the lamp, respectively of progressively decreasing magnitudes and increasing pulse-widths, beginning with an initial driving current pulse signal of a maximum magnitude and minimum pulse-width when the power element is first driven, until a steady-state operating condition of the lamp is effected at which time the driving current remains constant for the duration of the input signal, and
wherein the response to detection of an overcurrent condition at the power MOSFET, of a magnitude substantially greater than the predetermined magnitude, the operating period of the power MOSFET is limited to provide a series of current pulses as the driving current to the lamp, for the duration of the input signal, thereby to prevent breakdown of the power MOSFET.

17. A semiconductor integrated circuit according to claim 16, wherein the power MOSFET is of an N-channel conductivity type.

18. A method of lighting a lamp, mounted on a vehicle, by a power MOSFET formed in a semiconductor integrated circuit device comprising the steps of:
 (a) supplying a control signal to turn on the lamp, the lamp having a resistance characteristic in which the resistance thereof is very small at the moment the lamp is first driven and which increases with time as heat is being generated therefrom;
 (b) switching the power MOSFET to an on state in accordance with application of the control signal;
 (c) detecting a magnitude of a current flowing through a source-drain path of the power MOSFET which is coupled to the lamp;
 (d) comparing the detected magnitude of the current according to step (c) with a predetermined magnitude, which corresponds to an overcurrent condition as that which would cause the power MOSFET to be destroyed;
 (e) changing the lighting period of the lamp when the magnitude of the current detected is greater than the predetermined magnitude so that the power MOSFET is switched to an off state in accordance with bringing a bistable circuit into a set state, wherein a period of time in which the bistable circuit remains in the set state varies in response to the magnitude of the current detected;
 (f) after step (e), bringing the bistable circuit into a reset state after a predetermined time is passed, so that the power MOSFET is again turned on; and
 (g) after step (f), repeating steps (c) to (f) if the magnitude of the current detected is greater than the predetermined magnitude,
 wherein the magnitude of driving current to the lamp, flowing through the source-drain path of the power MOSFET, is inversely responsive to the amount of heat being generated by the lamp, the driving current during a normal operating condition of the lamp is in the form of intermittent pulse signals during an initial part of the operation of the lamp, respectively of progressively decreasing magnitudes and increasing pulse-widths, beginning with an initial driving current pulse signal of a maximum magnitude and minimum pulse-width when the power MOSFET is first driven, until a steady-state operating condition of the lamp is effected at which time the driving current remains constant for the duration of an operating period of the lamp, and
 wherein in response to an overcurrent condition at the power MOSFET, resulting from a short-circuit condition of the lamp, the on state period of the power MOSFET is limited to provide a continuing series of narrow current pulses, at regular intervals, as the driving current to the lamp thereby to prevent breakdown of the power MOSFET.

19. A method of lighting a lamp according to claim 18, wherein said step (d) further includes:
 converting the detected magnitude of the current into a voltage signal,
 generating a saw-tooth voltage by a saw-tooth generator, and
 comparing said voltage signal with said saw-tooth voltage to determine a period when the saw-tooth voltage is greater than the voltage signal; and
 wherein said step (e) further includes:
 controlling the operating period of the power MOSFET for lighting the lamp in accordance with the comparison of said voltage signal and said saw-tooth voltage thereby controlling the set and reset states of the bistable circuit.

20. A power switching circuit according to claim 14, wherein the power output element, driver means and said circuit are formed on a common semiconductor substrate.

21. A power switching circuit according to claim 20, wherein the power output element is a power MOSFET.

22. A power switching circuit according to claim 21, further comprising:
 a power supply terminal to which a power supply voltage is supplied; and
 an output terminal,
 wherein the power MOSFET has a source-drain path coupled between the power supply terminal and the output terminal and a gate coupled to receive the output signal of the driver means.

23. A power switching circuit according to claim 22, wherein said circuit includes:
 a first sense circuit for detecting a first current flowing into the power MOSFET when voltage on the output terminal is lower than a predetermined voltage;
 a second sense circuit for detecting a second current flowing into the power MOSFET when the voltage on the output terminal is higher than the predetermined voltage;
 a selecting circuit for selecting that one of said first and second currents which has the greater magnitude;
 current-voltage converting means for converting the one of said first and second currents selected, in accordance with the magnitude thereof, into a voltage signal;
 a saw-tooth wave generator for forming a saw-tooth voltage waveform including a series of saw-tooth waves in response to the input signal; and
 a comparator circuit for comparing the converted voltage signal with the saw-tooth voltage waveform and for providing an indication signal which indicates when the amplitude of the converted voltage signal is greater than or equal to that of the saw-tooth voltage waveform with respect to each occurrence of a saw-tooth wave,
 wherein the flip-flop is set to the first state by each start of a saw-tooth wave of the saw-tooth wave generator and is set to the second state by the indication signal, said flip-flop having an output being supplied to an input of said driver means so as to control the operation of the driver means.

24. A power switching circuit according to claim 23, wherein the driver means includes:
 a booster circuit for boosting said power supply voltage to a voltage level of said power supply voltage plus the threshold voltage of said power MOSFET, wherein said boosted voltage is supplied to the gate of the power MOSFET,
 a first control MOSFET having a gate coupled to receive the input signal and a source-drain path coupled between the gate of the power MOSFET and a ground potential terminal of the circuitry, and
 a second control MOSFET having a gate coupled to receive the output of the flip-flop and a source-drain path coupled between the gate of the power MOSFET and the ground potential terminal.

25. A power switching circuit according to claim 24, wherein the load element is a lamp with a filament.

26. A power switching circuit according to claim 25, wherein the power MOSFET is of an N-channel conductivity type.

27. A power switching circuit according to claim 10, wherein the load element to be coupled has a resistance characteristic and wherein the resistance thereof is very small at a moment when the load element is driven and that the resistance thereof increases with time as heat is being generated therefrom.

28. A power switching circuit according to claim 27, wherein the load element is a lamp with a filament.

29. A semiconductor integrated circuit according to claim 17, wherein said bistable circuit includes a flip-flop.

30. A semiconductor integrated circuit according to claim 16, wherein said bistable circuit includes a flip-flop.

31. A method of lighting a lamp according to claim 19, wherein said bistable circuit includes a flip-flop.

32. A method of lighting a lamp according to claim 18, wherein said bistable circuit includes a flip-flop.

33. A power switching circuit according to claim 15, wherein the overcurrent condition is effected by a short-circuit condition of the lamp.

34. A power switching circuit according to claim 23, wherein the overcurrent condition is effected by a short-circuit condition of the lamp in which the operating period of the power MOSFET is time-wise limited to a small and constant portion of each of the saw-tooth waves thereby limiting the driving current for the load element to narrow pulses provided at regular intervals for the duration of the input signal.

35. A semiconductor integrated circuit according to claim 16, wherein upon detection of the overcurrent condition effected from a short-circuit condition of the lamp, the control means provides a periodic control signal to effect a driving current for the lamp comprised of narrow pulses provided at regular intervals for the duration of the input signal.

36. A method of lighting a lamp according to claim 18, wherein the overcurrent condition results from short-circuit breakdown of the lamp.

37. A power switching circuit, comprising:
a power MOSFET having a source-drain path coupled between a terminal for receiving a power supply potential and a load element and providing a driving current to said load element;
driver means coupled to the power MOSFET and providing an output signal to drive said power MOSFET in response to an input signal; and
a circuit for detecting a current flowing through the power MOSFET and for controlling operation of the driver means in accordance with a magnitude of the current detected so that an operating period of the power MOSFET will vary in inverse proportion to the magnitude of the detected current when the magnitude of the detected current is greater than a predetermined magnitude, including:
a bistable circuit coupled to the driver means and having first and second logic states, the first logic state thereof occurring when the driving current is being provided to the load element, and the second logic state thereof occurring when a supply of the driving current to the load element is being inhibited;
a first sense circuit for providing a first current indicative of detection of a first current magnitude flowing through the power MOSFET when voltage on an output terminal is lower than a predetermined voltage, the output terminal being effected at the coupling of the power MOSFET to the load element;
a second sense circuit for providing a second current indicative of detection of a second current magnitude through the power MOSFET when the voltage on the output terminal is higher than the predetermined voltage;
a selecting circuit for selecting that one of said first and second currents which has the greater magnitude;
current-voltage converting means for converting the one of said first and second currents selected, in accordance with the magnitude thereof, into a voltage value at each occurrence of an operating period of the power MOSFET;
a saw-tooth wave generator for forming a saw-tooth voltage waveform including a series of saw-tooth waves, each of a time-wise decreasing magnitude, in response to an input signal; and
a comparator circuit for comparing each converted voltage value with a respective saw-tooth wave and for providing an indication signal indicative of when the saw-tooth wave declines to a voltage value that is equal to or less than the converted voltage value,
wherein the bistable circuit is set to the first state by each start of a saw-tooth wave of the saw-tooth wave generator and is set to the second state by the indication signal, said flip-flop having an output being supplied to an input of said driver means so as to control the operation of the driver means, and
wherein said load element has a resistance characteristic in which the resistance thereof is very small at a moment when the load element is driven and that the resistance thereof increases with time as heat is being generated therefrom.

38. A power switching circuit according to claim 37, wherein the power MOSFET, the driver means and the circuit are formed on a common semiconductor substrate.

39. A power switching circuit according to claim 37, wherein the bistable circuit is an RS flip-flop.

40. A power switching circuit according to claim 39, wherein the first and second states are the reset and set operating states of the RS flip-flop.

41. A power switching circuit according to claim 40, wherein the magnitude of the driving current is inversely responsive to the amount of heat being generated from the load element.

42. A power switching circuit according to claim 41, wherein the load element is a lamp with a filament.

43. A power switching circuit according to claim 37, wherein the magnitude of the driving current is inversely responsive to the amount of heat being generated from the load element.

44. A power switching circuit according to claim 43, wherein the load element is a lamp with a filament.

45. A power switching circuit, comprising:
a power output element coupled to a load element and providing a driving current to the load element;

driver means coupled to the power output element and providing an output signal to drive the power output element in response to an input signal; and a circuit which includes means for detecting a current flowing into the power output element and means for controlling operation of the driver means in accordance with a magnitude of the current detected by the detecting means so that an operating period of the power output element will vary in inverse proportion to the magnitude of the detected current when the magnitude of the detected current is greater than a predetermined magnitude, wherein the controlling means includes a flip-flop circuit coupled to the driver means and having first and second logic states, the first logic state thereof occurring when the driving current is being provided to the load element, and the second logic state thereof occurring when a supply of the driving current to the load element is being inhibited, wherein the load element to be coupled has a directly varying resistance-heat characteristic relationship during normal operation thereof in which the resistance thereof is very small at a moment when the load element is first driven and that the resistance thereof increases with time as heat is being generated therefrom, wherein upon start-up of operation of the power element, in response to said input signal, the driving current is provided as intermittent pulse signals to operate the load element, the pulse signals are provided as long as the magnitude of the detected current is greater than the predetermined magnitude, and wherein the magnitude of each additional driving current pulse signal, when the load element is operating normally, is progressively decreased and the pulse-width thereof is increased from that of the preceding pulse signal until a steady-state load element operating condition is effected at which time the driving current remains constant for the duration of the input signal, the decrease in magnitude of each additional pulse signal, starting from an initial driving current pulse signal of maximum magnitude and minimum pulse-width, is in response to a corresponding increase in resistance of the load element.

46. A power switching circuit according to claim 45, wherein in response to detection of an overcurrent condition at the power output element resulting from a malfunction of the load element, the operation period of the power output element is limited to provide a series of current pulses of substantially constant magnitude and pulse-width as the driving current to the load element, for the duration of the input signal, thereby to prevent breakdown of the power output element.

47. A power switching circuit according to claim 46, wherein the load element is a lamp with a filament.

* * * * *